April 19, 1955 W. G. HENSEL 2,706,783

CRYSTAL CONTROLLED OSCILLATORS

Filed Jan. 27, 1950

INVENTOR
W. G. HENSEL
BY W. J. O'Neill
ATTORNEY

United States Patent Office 2,706,783

Patented Apr. 19, 1955

2,706,783

CRYSTAL CONTROLLED OSCILLATORS

Waldo G. Hensel, Chatham, N. J., assignor to Bell Telephone Laboratories, Incorporated, New York, N. Y., a corporation of New York Application January 27, 1950, Serial No. 140,807

11 Claims. (Cl. 250—36)

Figure 1:
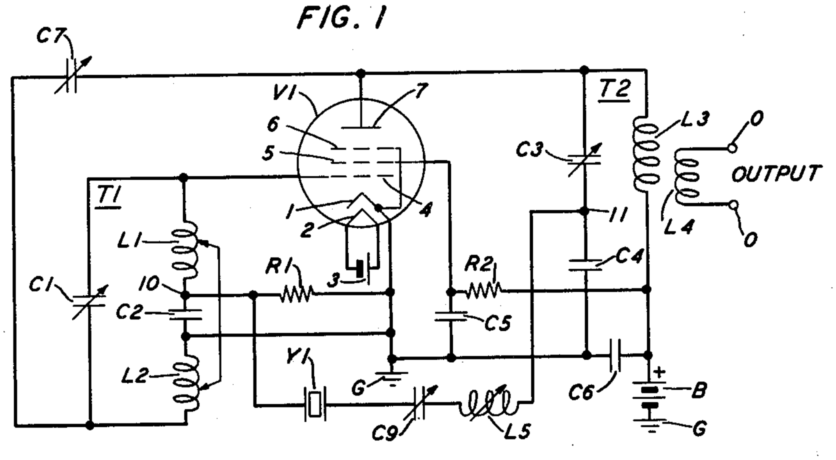

This invention relates to oscillation generators and particularly to crystal oscillators of the series-resonant type wherein the piezoelectric crystal body is operated at or near its series-resonant frequency, which may be a value up to 100 megacycles per second for example.

One of the objects of this invention is to provide a stable crystal oscillator which may be operated at or very near the true series-resonant frequency of the associated piezoelectric crystal body.

Another object of this invention is to minimize frequency discrepancies and phase shift errors that may be caused by circuit variations and stray capacity effects, and to provide improved efficiency and frequency stability.

Another object of this invention is to provide improved operation at the higher crystal frequencies, and to increase the gain of the circuit.

Another object of this invention is to reduce errors in the setting of the associated tuning circuits that may be caused by shifting the maximum voltage condition away from the true series-resonant frequency of the associated crystal body as a result of stray capacitances across crystal terminating impedances.

Piezoelectric crystals are often used as circuit elements in oscillators in order to stabilize the frequency of oscillation. The choice of the type of oscillator circuit to be utilized with the piezoelectric crystal body is often determined by the degree of stability desired, by the frequency desired to be used, and by other factors. One of the types of crystal oscillator circuits that may be utilized is known as the series-resonant type of crystal oscillator circuit. In this type of circuit, the circuit operating frequency is desired to be the series-resonant frequency of the associated piezoelectric crystal body disposed in the feedback path thereof.

In such series-resonant type crystal oscillators, the frequency of oscillation is affected and also limited in maximum frequency obtainable by the amount of stray capacity effects associated with the circuit components, such as those associated with the oscillator tube, the crystal unit and the crystal terminating impedances. Such stray capacity effects may decrease the circuit gain, as well as introduce phase shift errors and frequency instability into the circuit by shifting the maximum voltage condition away from the true series-resonant frequency of the associated crystal body.

In accordance with this invention, a crystal oscillator circuit is provided which may be operated at or very near the true series-resonant frequency of the associated piezoelectric crystal, and which may be provided with means adapted to minimize frequency discrepancies caused by stray capacity and other circuit variations, and to provide improved efficiency and frequency stability with respect to supply voltage and other variations. The circuit may comprise an oscillator tube having tuned grid and tuned plate circuits wherein energy to permit oscillation is fed back, at relatively low impedance, from the plate to the grid electrodes of the associated vacuum tube gain source through the piezoelectric crystal body when the associated grid and plate circuits are tuned to the low impedance or series-resonant frequency of the crystal body.

In accordance with a feature of this invention, the feedback oscillation energy may be coupled from the plate to the grid circuits of the associated oscillator tube by means of coupling reactances which in a particular case may take the form of coupling condensers disposed in the respective oscillator tube grid and plate circuits and connected with the piezoelectric crystal element. In such an arrangement the crystal element may for example be connected at one side thereof to one coupling condenser disposed in the capacitance branch of the tuned plate circuit, and at the other side thereof the crystal element may be connected to another coupling condenser disposed in the inductance branch of the tuned grid circuit.

Where the respective coupling condensers are made relatively large in capacitance values in comparison to the capacitances of the associated tuning condensers for their respective tuned grid and plate circuits, source and load impedances may be thereby provided for the crystal feedback circuit which are of relatively small impedance values compared to the series-resonant impedance of the associated crystal body. With this arrangement, the amplitude of the feedback voltage may be critically dependent upon the magnitude of the crystal impedance, and oscillation may then occur only at or very near the true series-resonant frequency of the piezoelectric crystal body. Moreover, by the use of such coupling condensers disposed in the capacitance branch of the plate or one tuned circuit and in the inductance branch of the grid or other tuned circuit, the correct phase shift for the feedback circuit voltage is obtained, and without the use of power consuming resistors which have heretofore been used as crystal coupling terminating impedances.

Alternatively, the crystal coupling condensers provided as terminating impedances for the crystal body in accordance with this invention, may be placed respectively in the inductive branch of the tuned plate circuit and the capacitance branch of the tuned grid circuit, instead of in the capacitance branch of the tuned plate circuit and the inductance branch of the tuned grid circuit.

As another alternative arrangement for coupling from the crystal to the grid circuit of the associated oscillator tube, a portion of the tuned grid circuit inductance winding may serve as the coupling means, in place of a coupling condenser.

In order to obtain good plate circuit efficiency, a relatively large grid circuit driving voltage is desirable and in order to obtain this relatively large grid voltage without excessive crystal current, a relatively high grid circuit impedance may be utilized. However, with such a high grid circuit impedance present, an appreciable amount of stray energy may be fed back from the plate to the grid over a stray feedback path through the internal grid-plate capacity of the associated oscillator tube. This stray feedback path through the oscillator tube may result in certain undesirable effects in that it may lead to circuit instability such as a tendency of the circuit to oscillate independently of the piezoelectric crystal. Also, this stray feedback path through the oscillator tube when taken in combination with the desired feedback path through the crystal body, results in a phase displacement of the net feedback voltage such that the maximum amplitude of oscillation may occur at a frequency which is displaced somewhat from the desired true series-resonant frequency of the associated piezoelectric crystal body.

In order to eliminate such undesirable effects, the internal grid-plate capacity of the oscillator tube may be neutralized in accordance with a feature of this invention. For this purpose, a neutralizing condenser of suitable capacitance value to neutralize the internal tube capacity in the oscillator circuit may be connected between the plate and grid circuits of the oscillator tube, the internal capacity of which is to be neutralized. Such neutralization permits not only the use of a relatively high impedance in the grid circuit to thereby attain relatively large values of grid driving voltage and hence relatively high plate circuit efficiency without excessive crystal current, but also eliminates phase shift of the feedback voltage caused by the grid-plate capacity of the oscillator tube and thereby permits operation at or very near the true series-resonant frequency of the associated piezoelectric crystal body.

The oscillator circuit provided in accordance with this invention may be utilized with one or more piezoelectric crystals individually operating at their respective fundamental mode frequencies, and is also adaptable for use with one or more crystals individually operating at their respective mechanical harmonic mode frequencies. Where the several crystal frequencies all lie in a sufficiently narrow band, retuning of the plate and grid circuits may not be required. A number of such crystals of different frequencies may be selectively switched in and out of the crystal feedback circuit by means of a motor-driven or other suitable switching means.

Figure 1A:
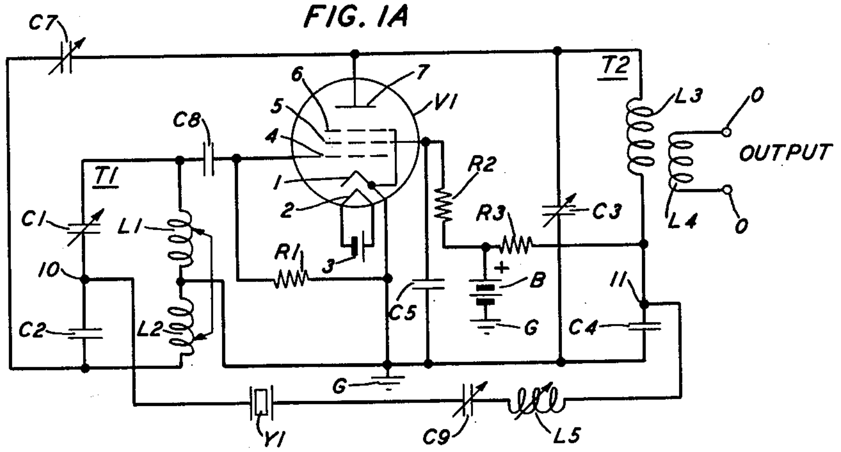
Figure 2:
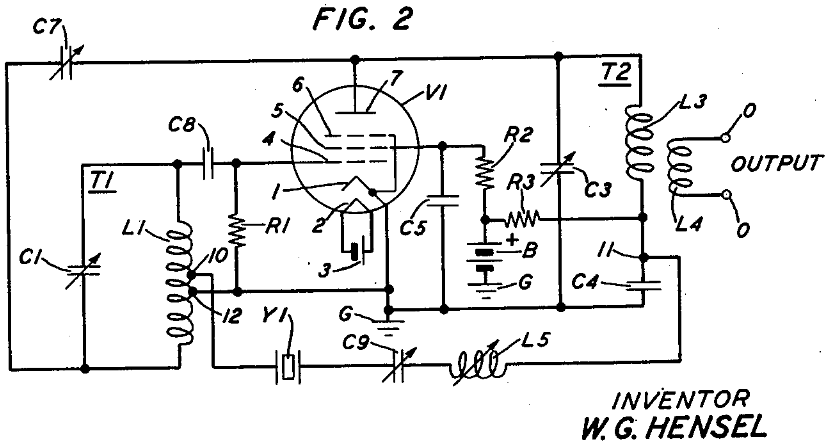

For a clearer understanding of the nature of this invention and the additional advantages, features and objects thereof, reference is made to the following description taken in connection with the accompanying drawings, in which like reference characters represent like or similar parts and in which:

Fig. 1 is a circuit diagram illustrating a series-resonant type of crystal oscillator in accordance with this invention;

Fig. 1A is a circuit diagram similar to that shown in Fig. 1 but illustrating a modification wherein the crystal coupling condensers are transposed and shown as respectively disposed in the capacitance branch of the tuned grid circuit and the inductance branch of the tuned plate circuit; and Fig. 2 is a circuit diagram similar to that shown in Fig. 1 but illustrating an alternative arrangement for the coupling reactance means.

Referring to the drawing, Fig. 1 is a circuit diagram illustrating a series-resonant type of crystal oscillator comprising an amplifier source of gain V1, which may be in the form of an electronic vacuum tube V1, a tuned input or grid circuit T1 for the oscillator tube V1, a tuned output or plate circuit T2 for the oscillator tube V1, a series-resonant type piezoelectric crystal body Y1 disposed in the feedback path of the oscillator tube V1 for controlling the frequency of the circuit oscillations, which may be taken off from the output circuit at terminals 0, and a pair of coupling reactance devices which may be in the form of coupling condensers C2 and C4 disposed in the tuned grid and plate circuits T1 and T2, respectively, and serving as crystal terminating impedances for the crystal circuit Y1.

As illustrated in Fig. 1, the oscillator tube V1 may be in the form of a pentode V1 having a grounded cathode electrode 1 which may be heated by a suitable heater filament 2 energized by a battery or other suitable power supply source 3, a control grid electrode 4 which may be connected through the tuned input or grid circuit T1 to the grounded cathode electrode 1, a screen grid electrode 5 which may be connected to ground G through a screen grid by-pass condenser C5 in order to permit the screen grid electrode 5 to operate at radio frequency ground potential and which also may be connected to the positive terminal (+) of a battery or other suitable power supply source B through a screen grid resistor R2 for providing a suitable voltage drop therein in order to obtain a proper direct-current operating potential for the screen grid electrode 5, a suppressor grid electrode 6 which may be connected in a known manner with the cathode electrode 1, and an anode or plate output electrode 7 which may be connected to the cathode electrode 1 through the tuned output circuit T2 and the plate circuit by-pass condenser C6, and which may be also connected with the positive terminal (+) of the power supply source B through the coil L3 of the tuned output circuit T2.

As illustrated in Fig. 1, the tuned input or grid circuit T1 comprises parallel-connected inductance and capacitance branches which may comprise a grid circuit inductance winding L1, the grid circuit crystal coupling condenser C2, a grid circuit inductance winding L2 which may be closely coupled to the inductance winding L1, as by being wound on the same coil form as the inductance winding L1 as indicated by the interconnected arrows shown in Fig. 1, and a grid circuit tuning condenser C1 which permits the input circuit consisting of the inductance coils L1 and L2, the condensers C1 and C2, the tube input capacity, and associated stray capacities and inductances, to be tuned to the desired operating frequency, which is the series-resonant frequency of the associated piezoelectric crystal body Y1. A grid leak or bias resistor R1 may be utilized to provide the proper negative grid bias voltage for the input or control grid electrode 4 of the oscillator tube V1.

The tuned output or plate circuit T2 comprises parallel-connected inductance and capacitance branches which may, as illustrated in Fig. 1, comprise a plate circuit inductance winding L3, the plate circuit crystal coupling condenser C4, the plate circuit by-pass condenser C6, and a plate circuit tuning condenser C3 which permits the output or plate circuit consisting of the inductance coil L3, the condensers C4 and C6, the tube output capacity to ground G, and associated stray capacities and inductances, to be tuned to the desired operating frequency, which is the series-resonant frequency of the piezoelectric crystal body Y1. Accordingly, the tuned input and tuned output circuits T1 and T2 may be tuned to the same operating frequency corresponding to the series-resonant frequency of the piezoelectric crystal circuit Y1. An output circuit coupling coil L4 connected with the output terminals 0 may be coupled to the plate circuit inductance coil L3 in order to provide for the removal of radio frequency power from the associated oscillator circuit.

As illustrated in Fig. 1, the piezoelectric crystal body Y1 may be disposed in the feedback path of the oscillator tube V1, the feedback path extending from the plate electrode 7 to the control grid electrode 4 thereof over the circuit including the plate circuit T2, the crystal circuit Y1, and the grid circuit T1. The crystal circuit per se includes the crystal body Y1 connected with connection points at 10 and 11 on the tuned input and output circuits T1 and T2, respectively, the crystal circuit being capacitively terminated by means of terminating impedances in the form of the coupling condensers C2 and C4 connected to ground G.

Also, as shown in Fig. 1, a neutralizing condenser C7 may be connected in circuit between the plate electrode 7 of the oscillator tube V1 and the tuned grid or input circuit T1 thereof in order to neutralize the internal control grid-to-plate capacity of the oscillator tube V1, for purposes as described more fully hereinafter.

The crystal unit Y1 may comprise any suitable piezoelectric crystal body capable of operating at its series-resonant frequency which may be the fundamental mode frequency thereof, or a third, fifth, or other mechanical harmonic mode overtone thereof. Where a comparatively high crystal operating frequency is desired, an AT-cut or a BT-cut thickness mode quartz crystal element may be conveniently utilized as the frequency determining element Y1, and the desired mode frequency thereof may be the fundamental or the third, fifth, seventh or other odd order harmonic mode frequency thereof, corresponding to the frequency desired for the crystal oscillator circuit oscillations. Such AT-cut or BT-cut quartz crystals with electrodes, mountings and holders therefor adapted to form a crystal unit Y1, are disclosed for example in United States Patents No. 2,218,200, issued October 15, 1940 to Lack, Willard and Fair, and No. 2,453,435, issued November 9, 1948 to H. Havstad. While such AT-cut or BT-cut quartz crystals have been particularly mentioned as examples, it will be understood that the piezoelectric crystal unit Y1 may comprise any suitable type of piezoelectric crystal body adapted for operating at a series-resonant frequency thereof.

The piezoelectric crystal unit Y1 comprises the principal frequency determining element of the oscillator circuit and at its series-resonant frequency, which may be a fundamental mode or a mechanical harmonic overtone mode thereof, provides a feedback path for radio frequency oscillation energy to be transferred from the plate output circuit T2 to the grid input circuit T1, and thus to permit oscillation at a desired series-resonant frequency of the crystal body Y1.

While the operating frequency may be made to vary slightly from the true series-resonant frequency of the crystal body Y1 by adjusting the tuning at C1 and C3 of the associated tuning circuit T1 or T2, maximum voltage is obtained when the associated tuning circuits T1 and T2 are tuned to the series-resonant frequency of the crystal body Y1. Accordingly, when some adjustment in operating frequency is desired, the operating frequency of oscillation may better be adjusted by providing variable reactance means such as a condenser C9 or inductance coil L5, or both, disposed in series with the piezoelectric crystal body Y1. In this arrangement, the operating frequency may be raised by connecting the condenser C9 in series with the crystal body Y1 which arrangement operates the crystal Y1 as an inductance since the crystal Y1 and the condenser C9 in series therewith, then act as a resistance. In a similar manner, the circuit frequency may be lowered by connecting the inductance coil L5 in series with the crystal body Y1; and to adjust the frequency of oscillation both above and below the series-resonant frequency of the crystal body Y1, the inductance coil L5 and the variable condenser C9 may be connected in series with the crystal body Y1, the frequency of oscillation then being the frequency at which the reactance of that series combination including the crystal body Y1 is zero.

It will be noted that, as illustrated in Fig. 1, the frequency determining crystal circuit comprising the series-resonant crystal Y1 is terminated at its opposite ends 10 and 11 by means of the terminating impedances comprising the coupling condensers C2 and C4, respectively, both of which are connected to the cathode electrode 1 of the oscillator tube V1. This capacitive reactance type of termination for the crystal Y1 provides certain advantages in a series-resonant type of crystal oscillator in that improved operation may be obtained, relatively higher operating frequencies may be realized in practice, and stray capacitance effects, phase shift errors and circuit instabilities may be eliminated or reduced, and the gain of the circuit may be increased.

The terminating impedances for the crystal Y1 being in the form of capacitance devices C2 and C4 may be comparatively free from stray capacities and the effects thereof. Stray capacities, if present across the crystal terminating impedances as in the case of terminating impedances in the form of resistors, produce errors in the setting of the tuning circuits T1 and T2 by shifting the maximum voltage tuning condition away from the true-series-resonant frequency of the crystal body Y1. Accordingly, by providing terminating impedances in the form of the reactances C2 and C4, such errors in tuning and the resulting circuit instabilities may be eliminated or reduced. Also, such stray capacities if present across the terminating impedances, may decrease the gain of the circuit and also limit the maximum frequency obtainable from the circuit in addition to introducing the tuning errors referred to. The maximum frequency and also the gain of the circuit is limited by the amount of stray capacity shunting not only the crystal body Y1 but also that shunting the terminating impedances therefor. Accordingly, by providing terminating impedances in the form of the coupling reactance devices C2 and C4, the gain and maximum frequency obtaining from the circuit may be increased. By keeping the stray capacities low, the circuit may be operated at frequencies up to 100 megacycles or more per second, corresponding to the series-resonant frequency of the crystal body Y1.

As particularly illustrated in Fig. 1, the crystal Y1 is, at one side thereof, connected at 11 to the coupling condenser C4 disposed in the capacitance branch of the tuned plate circuit T2, and at the other side thereof is connected at 10 to the other coupling condenser C2 disposed in the other or inductance branch of the tuned grid circuit T1. This arrangement provides the required 180-degree phase shift for the oscillator feedback path voltage. The coupling condensers C2 and C4 may be made of relatively large capacitance values in comparison with the smaller capacitance values for the tuning condensers C1 and C3 of their respective circuits T1 and T2, thus providing source and load impedances for the crystal feedback circuit which are small compared to the series-resonant impedance of the crystal Y1. With this arrangement, the amplitude of the feedback voltage may be critically dependent upon the magnitude of the relatively low crystal impedance, and oscillation may occur only at or very near the series-resonant frequency of the crystal Y1.

It will be noted that, in accordance with a feature of this invention, the method used here to couple oscillation energy from the plate circuit T2 to the grid circuit T1 with the correct phase shift avoids the use of power consuming resistors and instead employs coupling reactances which give the correct phase shift in the oscillator loop circuit and which as particularly shown in Fig. 1 may take the form of coupling condensers C2 and C4 disposed, respectively, in the inductive branch of the tuned grid circuit T1 and the capacitance branch of the tuned plate circuit T2.

Alternatively, as illustrated in Fig. 1A, the coupling condensers C2 and C4 may be transposed and disposed respectively, in the capacitance branch of the tuned grid circuit T1 and the inductance branch of the tuned plate circuit T2, in which case the power supply voltage from the supply source B may be supplied to the tube plate 7 through a suitable plate resistor R3 for example, and also a condenser C8 may be utilized to prevent short-circuiting of the grid bias resistor R1.

In order to obtain good plate or output circuit efficiency, a relatively large grid input driving voltage is desirable, and in order to obtain this large grid voltage without excessive current through the crystal Y1, a relatively high value of grid circuit impedance may be utilized. With such a high value of grid circuit impedance, an appreciable amount of stray energy may be fed from the plate electrode 7 to the grid electrode 4 through the stray feedback path comprising the internal grid-to-plate capacity of the oscillator tube V1. This stray feedback path through the oscillator tube V1 may produce undesirable results. It leads to circuit instability or a tendency of the circuit to oscillate independently of the controlling piezoelectric crystal body Y1. Also, this stray feedback path through the oscillator tube V1 when taken in combination with the desired feedback path through the crystal body Y1 results in a phase displacement of the net feedback voltage such that maximum amplitude of oscillation occurs at a frequency which is somewhat displaced from the true series-resonant frequency of the crystal Y1. To eliminate these undesirable effects, the neutralizing condenser C7 may be used to neutralize the internal grid-to-plate capacity of the oscillator tube V1.

Accordingly, in accordance with a feature of this invention, an oscillator circuit may be provided in which neutralization of the internal capacity of the oscillator tube V1 may be realized by means of the neutralizing condenser C7. Such neutralization permits the use of a high impedance in the grid circuit T1, and this high impedance makes it possible to attain large values of grid driving voltage with resultant high plate circuit efficiency and without excessive current in the crystal Y1. Such neutralization also eliminates phase shift of the feedback voltage by the internal grid-to-plate capacity of the tube V1 and permits oscillator operation at the true series-resonant frequency of the crystal Y1.

The filtering action of the two tuned circuits T1 and T2 of Fig. 1 permits the circuit to be made to have a low harmonic output from harmonics generated by the vacuum tube V1. Also, the capacitive termination at C2 and C4 for the crystal body Y1 eliminates the phase shift error that would be caused by stray capacitances across terminating impedances of non-capacitance forms.

In accordance with this invention, the oscillator may be operated at or near the true series-resonant frequency of the associated crystal Y1, the oscillator tube V1 having tuned grid and tuned plate circuits T1 and T2, wherein radio frequency energy to permit oscillation is fed, at relatively low impedance, from the plate 7 to the control grid 4 of the associated oscillator tube V1 through the crystal Y1 when the plate and grid circuits T2 and T1 are tuned to the low impedance or true series-resonant frequency of the crystal Y1.

As an illustrative example in a particular case, an oscillator constructed in accordance with the circuit of Fig. 1 and operating at a series-resonant crystal frequency having a particular value in the region from 4.2 to 4.5 megacycles per second for example, with the respective grid and plate circuits T1 and T2 both tuned to the particular series-resonant frequency of the crystal body Y1, may have component values as follows: The crystal Y1 may be an AT-cut type of quartz crystal element operating at its thickness-shear fundamental mode series-resonant frequency. The vacuum tube V1 may be an RCA 5618 pentode, or other suitable source of gain. The power supply source B may be a +300-volt source or other suitable source of power supply voltage for the oscillator tube V1. The resistors may have values approximately as follows, expressed in ohms: R1=51,000, R2=300,000. The condensers may have values approximately as follows, expressed in micromicrofarads: C1=175; C2=3000; C3=30; C4=3600; C5=10,000; C6=2700; C7=0.1 to 0.5 or other value sufficient to neutralize the internal capacity of the oscillator tube V1; C9=200 or other value suitable to adjust the crystal circuit frequency slightly, if desired. The inductance windings may have values roughly as follows, expressed in millihenries: L1 and L2=0.0035; L3=0.035; L4=0.0035, and L5 if used=0.006 or other value suitable to adjust the crystal circuit frequency slightly, if desired.

Fig. 1A, as hereinbefore indicated, is a circuit diagram of a series resonant type crystal oscillator similar to that shown in Fig. 1 but illustrating an alternative arrangement for the coupling condensers C2 and C4, wherein the coupling condenser C2 is disposed in the capacitance branch of the grid input tuned circuit T1 instead of being disposed in the inductance branch thereof as shown in Fig. 1, and wherein the coupling condenser C4 is disposed in the inductance branch of the plate output tuned circuit T2 instead of being disposed in the capacitance branch thereof as shown in Fig. 1. Also as shown in Fig. 1A, a grid coupling condenser C8 may be utilized to prevent short-circuiting of the grid bias resistor R1.

Fig. 2 is a circuit diagram of a series resonant type crystal oscillator similar to that shown in Fig. 1A but illustrating an alternative arrangement of reactance type coupling from the crystal body Y1 to the tuned grid circuit T1 of the oscillator tube V1. As illustrated in Fig. 2 a portion 10, 12 of the grid circuit inductance winding L1 may serve as the coupling means and crystal terminating means, in place of the condenser C2 shown in Fig. 1A. It will be noted that the condenser C2 of Fig. 1A may be omitted particularly at the higher frequencies, the crystal Y1 then being connected to the tap 10 on the coil L1 as shown in Fig. 2, and the condenser C4 giving as in Fig. 1A, the tap-off voltage for the feedback circuit leading from the tuned plate circuit T2 to the crystal Y1.

It will be understood that a number of crystals Y1 of different series-resonant frequencies may be selectively utilized in these circuits, by individually connecting them into and out of circuit by means of any suitable switching means, and that these circuits are adaptable to the use of crystals Y1 operating individually at their fundamental mode series-resonant frequencies and also operating individually at their mechanical harmonic mode overtone series-resonant frequencies.

Although this invention has been described and illustrated in relation to specific arrangements, it is to be understood that it is capable of application in other organizations and is therefore not to be limited to the particular embodiments disclosed.

What is claimed is:

1. A crystal oscillator circuit comprising an electronic gain source having input, output and cathode electrodes, tuned input and output circuits for said gain source, each of said tuned circuits comprising a tuning condenser device and an inductor device disposed respectively in parallel-connected capacitance and inductance branches thereof, a feedback path disposed between said output and input electrodes and including therein said tuned output and input circuits, a series-resonant frequency type piezoelectric crystal body disposed in said feedback path between said tuned output and input circuits, said tuned input and output circuits being tuned substantially to said series-resonant frequency of said crystal body, and terminating impedance means for said crystal body comprising a reactance element disposed in each of said tuned input and output circuits, each of said reactance elements having its terminals connected respectively to said crystal body and said cathode electrode, at least one of said reactance elements comprising an additional condenser disposed in said tuned output circuit, said additional condenser having a capacitance value substantially larger than the capacitance of said tuning condenser device of said tuned output circuit, and means including a neutralizing condenser separately connected between said tuned output and input circuits for substantially neutralizing the internal electrode capacity of said gain source.

2. A crystal oscillator circuit in accordance with claim 1, one of said reactance elements being disposed in said capacitance branch of said tuned output circuit and another of said reactance elements being disposed in said inductance branch of said tuned input circuit.

3. A crystal oscillator circuit comprising an electronic gain source having tuned input and output circuits connected therewith, a series-resonant frequency type piezoelectric crystal body disposed in the feedback path between said tuned output and input circuits, said tuned input and output circuits each comprising a tuning condenser and an inductor disposed respectively in parallel-connected capacitance and inductance branches thereof, said tuned input and output circuits each being tuned substantially to said series-resonant frequency of said crystal body, a coupling reactance means disposed in said capacitance branch of one but not the other of said tuned input and output circuits and comprising an additional condenser connected in series with said tuning condenser therein, and a connection point disposed intermediate said last-mentioned additional condenser and tuning condenser and connected to said feedback path crystal body, a coupling reactance means disposed in said inductance branch of said other of said tuned input and output circuits and comprising an additional condenser connected in series with said inductor therein, and a connection point disposed intermediate said last-mentioned additional condenser and inductor and connected to said feedback path crystal body, said respective additional condensers having capacitance values substantially larger than the capacitance values of said respective tuning condensers of their said respective tuned input and output circuits, means comprising said respective coupling means connected to said crystal body for coupling feedback oscillation energy from said tuned output circuit to said tuned input circuit through said crystal body, and means including a neutralizing condenser separately connected between said tuned output and input circuits for substantially neutralizing the internal electrode capacity of said oscillator gain source, said neutralizing means in combination with said respective coupling means constituting means for permitting oscillations in said oscillator circuit substantially at the true series-resonant frequency of said crystal body.

4. A crystal oscillator circuit comprising a piezoelectric crystal body, an electronic gain source having grid input and plate output circuits tuned substantially to a series-resonant frequency of said crystal body, feedback circuit means for feeding back oscillations substantially at said series-resonant frequency from said plate circuit to said grid circuit through said crystal body, said tuned plate and tuned grid circuits each having a tuning condenser and an inductor disposed respectively in parallel-connected capacitance and inductance branches thereof, a crystal coupling means comprising an additional condenser disposed in series with said tuning condenser in said capacitance branch of one but not the other of said tuned grid and plate circuits and a connection point disposed intermediate said last-mentioned coupling condenser and tuning condenser and connected to said feedback circuit crystal body, a crystal coupling means comprising an additional condenser disposed in series with said inductor in said inductance branch of the said other of said tuned grid and plate circuits and a connection point disposed intermediate said last-mentioned coupling condenser and inductor and connected to said feedback circuit crystal body, and means comprising said crystal body connected at opposite sides thereof to said crystal coupling condensers in said respective capacitance and inductance branches for coupling said oscillations from said plate to said grid circuits with substantially 180-degree phase shift in voltage in said feedback circuit, said respective coupling condensers having capacitance values sufficiently larger than the capacitance values of said tuning condensers of their said respective tuned grid and plate circuits to constitute impedance means having substantially comparable impedances with respect to the series-resonant impedance of said crystal body whereby the amplitude of said feedback voltage is critically dependent upon the magnitude of the impedance of said crystal body and said oscillations occur substantially only at said series-resonant frequency of said crystal body.

5. A crystal oscillator circuit in accordance with claim 4, and means substantially eliminating the phase shift effects of stray feedback energy through the internal electrode capacity of said gain source upon said oscillations of said series-resonant frequency comprising means including a neutralizing condenser connected between said plate and grid circuits for substantially neutralizing said internal electrode capacity of said oscillator gain source.

6. Crystal controlled oscillation generator apparatus comprising a pentode type vacuum tube having plate, suppressor grid, screen grid, control grid and grounded cathode electrodes, a tuned input circuit connected in circuit between said control grid and cathode electrodes, a tuned output circuit connected in circuit between said plate and cathode electrodes, a piezoelectric crystal body connected between said tuned output and input circuits in the feedback path of said vacuum tube, said tuned input and output circuits each being tuned substantially to the series resonant frequency of said crystal body, said crystal body constituting frequency determining means for providing substantially at its series-resonant frequency a feedback path for radio frequency oscillations transferred from said plate to said control grid circuits, said tuned input circuit comprising an inductor and a tuning condenser disposed respectively in parallel-connected inductance and capacitance branches thereof, a grid circuit crystal coupling means comprising an additional condenser disposed in series with said inductor in said inductance branch, and a connection point disposed intermediate said last-mentioned coupling condenser and inductor and connected to said feedback path crystal body, said tuned output circuit comprising an inductor and a tuning condenser disposed respectively in parallel-connected inductance and capacitance branches thereof, a plate circuit crystal coupling means comprising an additional condenser disposed in series with said tuning condenser in said last-mentioned capacitance branch, and a connection point disposed intermediate said last-mentioned coupling condenser and tuning condenser and connected to said feedback path crystal body, said grid circuit crystal coupling condenser being connected in circuit between said grounded cathode electrode and said tuned input circuit intermediate connection point connected to said crystal body, said plate circuit crystal coupling condenser being connected in circuit between said grounded cathode electrode and said tuned output circuit intermediate connection point connected to said crystal body, said grid and plate circuit crystal coupling condensers having capacitance values substantially larger than the capacitance values of said respective tuning condensers of their said respective tuned input and output circuits.

7. Crystal controlled oscillation generator apparatus in accordance with claim 6, and means comprising a neutralizing condenser connected in circuit between said plate and control grid electrodes of said tube for substantially neutralizing the internal control grid-to-plate capacity of said oscillator tube.

8. A crystal oscillator circuit in accordance with claim 3, said additional condenser disposed in said capacitance branch being disposed in said capacitance branch of said tuned output circuit, and said additional condenser disposed in said inductance branch being disposed in said inductance branch of said tuned input circuit.

9. A crystal oscillator circuit in accordance with claim 3, said additional condenser disposed in said capacitance branch being disposed in said capacitance branch of said tuned input circuit, and said additional condenser disposed in said inductance branch being disposed in said inductance branch of said tuned output circuit.

10. A crystal oscillator circuit comprising an electronic gain source having input, output and grounded cathode electrodes, a tuned input circuit connected with said input and cathode electrodes, a tuned output circuit connected with said output and cathode electrodes, a feedback path including therein a series-resonant frequency type piezoelectric crystal body connected between said tuned output and input circuits, said tuned circuits each being tuned substantially to said series-resonant frequency of said crystal body, said tuned circuits each comprising a tuning condenser and an inductor disposed respectively in parallel-connected capacitance and inductance branches thereof, and terminating reactance means for said crystal body comprising a pair of additional condensers disposed respectively in said capacitance and inductance branches of said respective tuned circuits, said additional condensers each having one terminal thereof connected to said feedback path crystal body and having the other terminal thereof connected to said grounded cathode electrode, said respective additional condensers having capacitance values substantially larger than the capacitance values of said tuning condensers of their said respective tuned circuits and sufficiently comparable in impedance to the series resonant impedance of said crystal body to permit oscillations in said oscillator circuit substantially at the true series resonant frequency of said crystal body.

11. A crystal oscillator circuit comprising an electronic gain source having input, output and grounded cathode electrodes, a tuned input circuit connected with said input and cathode electrodes, a tuned output circuit connected with said output and cathode electrodes, a feedback path including therein a series-resonant frequency type piezoelectric crystal body connected between said tuned output and input circuits, said tuned circuits each being tuned substantially to said series-resonant frequency of said crystal body, said tuned circuits each comprising a tuning condenser and an inductor disposed respectively in parallel-connected capacitance and inductance branches thereof, and terminating reactance means for said crystal body comprising a pair of additional condensers disposed respectively in said capacitance and inductance branches of said respective tuned circuits, said additional condensers each having one terminal thereof connected to said feedback path crystal body and having the other terminal thereof connected to said grounded cathode electrode, said respective additional condensers having capacitance values substantially larger than the capacitance values of said tuning condensers of their said respective tuned circuits and sufficiently comparable in impedance to the series resonant impedance of said crystal body to permit oscillations in said oscillator circuit substantially at the true series resonant frequency of said crystal body, and means including a neutralizing condenser separately connected between said respective tuned circuits for neutralizing the internal electrode capacity of said gain source sufficiently to obtain oscillations in said oscillator circuit substantially at the true series resonant frequency of said crystal body.

References Cited in the file of this patent

UNITED STATES PATENTS

| | | |
|---|---|---|
| 2,111,603 | Usselman | Mar. 22, 1938 |
| 2,189,770 | Samuel | Feb. 13, 1940 |
| 2,298,437 | Usselman | Oct. 13, 1942 |
| 2,298,774 | Parker | Oct. 13, 1942 |
| 2,515,971 | Usselman | July 18, 1950 |

FOREIGN PATENTS

| | | |
|---|---|---|
| 278,511 | Italy | Oct. 11, 1930 |